(12) United States Patent
Mitsuno

(10) Patent No.: US 8,884,659 B2
(45) Date of Patent: Nov. 11, 2014

(54) LOAD DRIVING DEVICE

(71) Applicant: NGK Spark Plug Co., Ltd., Nagoya (JP)

(72) Inventor: Junichiro Mitsuno, Konan (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

(21) Appl. No.: 13/972,376

(22) Filed: Aug. 21, 2013

(65) Prior Publication Data

US 2014/0055169 A1 Feb. 27, 2014

(30) Foreign Application Priority Data

Aug. 22, 2012 (JP) ................... 2012-183633

(51) Int. Cl.
*H03B 1/00* (2006.01)
*H03K 3/00* (2006.01)
*H03K 5/19* (2006.01)

(52) U.S. Cl.
CPC ....................... *H03K 5/19* (2013.01)
USPC ........... 327/109; 327/108; 327/110; 327/111; 327/112

(58) Field of Classification Search
CPC ............ H02M 1/32; H02H 9/001; H02H 9/02
USPC .......................................... 327/108, 109, 110
See application file for complete search history.

(56) References Cited

U.S. PATENT DOCUMENTS

| 7,154,240 B2 * | 12/2006 | Watanabe ..................... 318/434 |
| 7,457,089 B2 * | 11/2008 | Ohshima ......................... 361/86 |
| 8,497,715 B2 * | 7/2013 | Kanayama .................... 327/110 |
| 2006/0245123 A1 | 11/2006 | Yasue | |
| 2012/0104968 A1 * | 5/2012 | Shiu et al. ..................... 315/291 |

FOREIGN PATENT DOCUMENTS

JP 2006-308457 A 11/2006

* cited by examiner

*Primary Examiner* — John Poos
(74) *Attorney, Agent, or Firm* — Sughrue Mion, PLLC

(57) ABSTRACT

A load driving device includes a pulse driving circuit which has a capacitor between an output terminal and a ground potential, a level detection circuit which detects whether an output terminal voltage on the output terminal of the pulse driving circuit is at high level or at low level, a switching discharge unit for forming a discharge path through which electric charges charged in a capacitor are discharged by switching of a switch from a non-discharge side to a discharge side, and switching the switch to the discharge side over a discharge maintenance time in a state where the application of a pulse voltage by the pulse driving circuit stops and the output terminal voltage is maintained at high level, a post-discharge detection unit, and a determination unit.

8 Claims, 4 Drawing Sheets

LOAD DRIVING DEVICE

CROSS-REFERENCE TO RELATED APPLICATION

This application is based upon and claims the benefit of priority of Japanese Patent Application No. 2012-183633 filed on Aug. 22, 2012, the contents of which are incorporated herein by reference in its entirety.

BACKGROUND

The present invention relates to a load driving device including a pulse driving circuit which repetitively applies a pulse voltage to a resistive load.

Generally, for example, as a load driving device which drives a resistive load, such as a heater which heats a detection element of an oxygen sensor primarily made of a solid electrolyte body, such as zirconia, a load driving device including a pulse driving circuit which has an output terminal connected to the other end of the resistive load with one end grounded and repetitively applies a pulse voltage to the resistive load is used. In the load driving device, abnormality, such as short-circuiting to a ground potential or a power supply potential in a connection path of the pulse driving circuit and the resistive load or disconnection in the connection path, may occur. In particular, when short-circuiting to the ground potential or the power supply potential occurs, the continuous driving of the resistive load results in failure in the pulse driving circuit. For this reason, it is preferable that the load driving device includes an abnormality detection unit for appropriately detecting the occurrence of abnormality.

For example, JP-A-2006-308457 discloses a control device including a level specification unit for specifying which sort of short (short-circuiting) occurs in a path from a driving device to a load device.

SUMMARY

On the other hand, in the load driving device, reduction in the number of components of the circuit compared to the related art is in progress with a demand for reduction in cost or the like. Then, it has been found that it may not be possible to determine the occurrence of disconnection in the connection path of the pulse driving circuit and the resistive load, and the occurrence of short-circuiting, to the power supply potential, a first connection path connecting an output terminal of the pulse driving circuit and the other end of the resistive load in the connection path which can be determined in the related art. Specifically, for example, there is a case where a capacitor is provided between the output terminal of the pulse driving circuit and the ground potential, and a discharge path of electric charges charged in the capacitor is not other than the resistive load due to reduction in the number of components of the circuit, or the like. In this case, if the pulse driving circuit is turned on in a state where the connection path between the pulse driving circuit and the resistive load is disconnected, the capacitor between the output terminal of the pulse driving circuit and the ground potential remains charged, and the level of an output terminal voltage on the output terminal of the pulse driving circuit is fixed at high level. Meanwhile, even though the first connection path in the connection path is short-circuited to the power supply potential, similarly, the level of the output terminal voltage is fixed at high level. Accordingly, in these cases, even though the state where the output terminal voltage is fixed at high level is detected, it is not possible to distinguish between disconnection in the connection path and short-circuiting to the power supply potential. For this reason, when abnormality occurs in the connection path, it is not possible to appropriately give notification of the content of abnormality.

The invention has been accomplished in consideration of the above-described problem, and an object of the invention is to provide a load driving device including a pulse driving circuit which repetitively applies a pulse voltage to a resistive load, having an advantage of appropriately detecting abnormality which occurs in a connection path of the pulse driving circuit and the resistive load.

According to an aspect of the invention, a load driving device for driving a resistive load including a first end being grounded and a second end, the load driving device comprises:

a pulse driving circuit which has an output terminal connected to the second end of the resistive load, is configured to repetitively apply a pulse voltage to the resistive load, and includes a capacitor disposed between the output terminal and a ground potential;

a level detection circuit configured to detect whether an output terminal voltage on the output terminal of the pulse driving circuit is at high level or at low level;

a switching discharge unit which forms a discharge path through which electric charges charged in the capacitor are discharged by switching a switch from a non-discharge side to a discharge side, wherein when disconnection occurs in a connection path between the pulse driving circuit and the resistive load in a state where the application of the pulse voltage by the pulse driving circuit stops and the output terminal voltage is maintained at the high level, the switching discharge unit switches the switch to the discharge side over a discharge maintenance time sufficient to change the output terminal voltage from the high level to the low level;

a post-discharge detection unit configured to detect the level of the output terminal voltage by the level detection circuit after the switch returns to the non-discharge side; and a determination unit configured to determine the occurrence of disconnection in the connection path when the post-discharge detection unit detects the low level and determine the occurrence of short-circuiting of a first connection path connecting the output terminal and the second end of the resistive load to a power supply potential when the post-discharge detection unit detects the high level.

As described above, when the capacitor is provided between the output terminal of the pulse driving device and the ground potential, and when there is no discharge path of the electric charges charged in the capacitor to the ground potential other than the resistive load, the output terminal voltage may be fixed at high level on the output terminal of the pulse driving device.

The load driving device includes switching discharge unit for forming the discharge path through which electric charges charged in the capacitor are discharged by switching of the switch from the non-discharge side to the discharge side, and switching the switch to the discharge side over the discharge maintenance time in a state where the application of the pulse voltage by the pulse driving circuit stops and the output terminal voltage is maintained at high level. When disconnection occurs in the connection path between the pulse driving circuit and the resistive load, the switch of the switching discharge unit is switched to the discharge side to discharge electric charges charged in the capacitor through the discharge path, and thus the level of the output terminal voltage of the pulse driving circuit falls down to the low level.

When short-circuiting, to the power supply potential, the first connection path connecting the output terminal of the pulse driving circuit and the other end of the resistive load occurs, even though the switch of the switching discharge unit is switched to the discharge side to discharge electric charges charged in the capacitor through the discharge path, the level of the output terminal voltage of the pulse driving circuit is fixed at the power supply potential (high level).

Accordingly, it is detected by the post-discharge detection unit whether the output terminal voltage is at high level or low level after the switch of the switching discharge unit returns to the non-discharge side. With this, it is possible to determine the occurrence of disconnection in the connection path when low level is detected by the post-discharge detection unit, and to determine the occurrence of short-circuiting, to the power supply potential, the first connection path when high level is detected.

Therefore, in the load driving device, it is possible to appropriately detect the occurrence of disconnection in the connection path and the occurrence of short-circuiting, to the power supply potential, the first connection path from among abnormality in the connection path of the pulse driving circuit and the resistive load.

As the switching discharge unit, a configuration in which a resistor is used as the discharge path, one end of the resistor is connected to the output terminal of the pulse driving circuit, and the other end of the resistor is connected to the ground potential (low level) through a switching element, such as a transistor, or a switch, such as a relay, over the discharge maintenance time may be made. A configuration in which the other end of a resistor serving as the discharge path is connected to an I/O port of a microprocessor, and low level is output from the I/O port over the discharge maintenance time may be also made.

The load driving device may further includes: a preliminary detection unit configured to detect whether the output terminal voltage continuously has the high level, the low level, or otherwise in a state where the pulse driving circuit repetitively apply the pulse voltage continues to the resistive load before the execution of the switching discharge unit. The switching discharge unit is executed when the preliminary detection unit detects the continuation of high level.

The load driving device includes the preliminary detection unit, and when the continuation of high level is detected by the preliminary detection unit, the switching discharge unit is executed. With this, it is possible to appropriately detect abnormality, such as disconnection in the connection path or short-circuiting, to the power supply potential, the first connection path, before the execution of the switching discharge unit.

The load driving device may further include ground potential short-circuiting determination unit for determining the occurrence of short-circuiting, to the ground potential, the first connection path when the continuation of low level is detected by the preliminary detection unit.

In the load driving device, when the continuation of low level is detected by the preliminary detection unit, it is determined to be the occurrence of short-circuiting the first connection path to the ground potential. With this, in regard to abnormality in the connection path, it is possible to appropriately detect the occurrence of short-circuiting the first connection path to the ground potential, in addition to the occurrence of disconnection in the connection path and the occurrence of short-circuiting the first connection path to the power supply potential.

In the load driving device, the post-discharge detection unit may wait for until a waiting time elapsed after the switch returns from the discharge side to the non-discharge side and may detect the level of the output terminal voltage by the level detection circuit, and the waiting time may be set to a time longer than a first return time required for until the output terminal voltage returns to the high level after the switch returns from the discharge side to the non-discharge side when the first connection path is short-circuited to the power supply potential.

For example, a resistor is used as the discharge path of the switching discharge unit, one end of the resistor is connected to the output terminal of the pulse driving circuit, and the other end of the resistor is connected to the ground potential through the switch. A circuit configuration in which the other end of the resistor is also connected to the level detection circuit, the level of the output terminal voltage is detected through the resistor is considered. In the above circuit configuration, when short-circuiting, to the power supply potential, the first connection path occurs, even though the switch of the switching discharge unit is switched to the discharge side to connect the other end of the resistor to the ground potential, as described above, the output terminal of the pulse driving circuit to which one end of the resistor is connected is fixed at the power supply potential. In the interim, since the other end of the resistor is connected to the ground potential, in the level detection circuit, low level is detected. If the switch of the switching discharge unit returns from the discharge side to the non-discharge side, the level of the output terminal voltage which is detected by the level detection circuit through the resistor returns to the high level promptly. However, if the level of the output terminal voltage is detected immediately after the switch returns to the non-discharge side, the low level before returning to the high level is detected, and the high level which should be detected originally cannot be detected.

In the load driving device, after the switch of the switching discharge unit returns to the non-discharge side, the level detection circuit waits for until the waiting time longer than the first return time elapsed, and detects the level of the output terminal voltage. With this, when short-circuiting of the first connection path to the power supply potential occurs, it is possible to appropriately detect the high level of the output terminal voltage which should be detected by the post-discharge detection unit, thereby reliably detecting the occurrence of short-circuiting to the power supply potential.

In the load driving device, in the post-discharge detection unit, the waiting time may be set to a time shorter than a second return time required for until the output terminal voltage returns to the high level after the switch returns from the discharge side to the non-discharge side when disconnection in the connection path occurs.

When disconnection in the connection path occurs, even though the application of the pulse voltage by the pulse driving circuit stops, if the switch of the switching discharge unit returns from the discharge side to the non-discharge side, the capacitor may be charged again by the effect of a leak current or the like, and the output terminal voltage may gradually increase and return to the high level again.

In the load driving device, the waiting time is set to a time shorter than the second return time. For this reason, even though the output terminal voltage gradually increases, there is no case where the increase is detected as the high level. With this, even when disconnection in the connection path occurs, it is possible to appropriately detect the low level of the output terminal voltage which should be detected by the post-discharge detection unit, thereby reliably detecting the occurrence of disconnection in the connection path.

In the load driving device, the discharge maintenance time may be set to a time longer than a repetition cycle of the pulse voltage output from the pulse driving circuit.

In order to appropriately perform the determination in the determination unit, it is preferable that, when disconnection in the connection path occurs, the capacitor is discharged to maintain switching of the switch to the discharge side by the switching discharge unit over the time sufficient to fall the output terminal of the pulse driving circuit voltage down to the low level.

In the load driving device, since the discharge maintenance time is set to the time longer than the repetition cycle of the pulse voltage output from the pulse driving circuit, when disconnection in the connection path occurs, electric charges charged in the capacitor are sufficiently discharged, thereby falling the output terminal of the pulse driving circuit voltage down to the low level. With this, it is possible to appropriately perform the determination in the determination unit.

In the load driving device, the switching discharge unit may include a resistor with one end connected to the output terminal as the discharge path, and may switch the switch to the discharge side to set the potential on the other end of the resistor to the low level over the discharge maintenance time.

In the load driving device, the switching discharge unit includes the resistor with one end connected to the output terminal of the pulse driving circuit as the discharge path. The switching discharge unit sets the potential on the other end of the resistor to the low level over the discharge maintenance time by switching of the switch to the discharge side. With this, it is possible to discharge the capacitor with a simple configuration.

The load driving device may further include a microprocessor, in which the level detection circuit may include a digital input circuit which is provided in the microprocessor and connected to an input/output port of the microprocessor, the output terminal of the pulse driving circuit may be connected to the input/output port through the resistor, and the switching discharge unit may include a digital output circuit which is provided in the microprocessor, connected to the input/output port, and sets the potential on the other end of the resistor at low level.

In the load driving device, the level detection circuit includes the digital input circuit (input port) connected to the input/output port of the microprocessor, and the output terminal of the pulse driving circuit is connected to the input/output port through the resistor forming the discharge path of the switching discharge unit. The switching discharge unit includes the digital output circuit (output port) which is connected to the input/output port, and sets the potential on the other end of the resistor to the low level. Accordingly, the level detection circuit and the switching discharge unit can use the input/output port together, and the resistor of the switching discharge unit can also be used as a resistor for protecting the digital input circuit in the level detection circuit.

With this, it is not necessary to prepare individual circuits outside the microprocessor as the level detection circuit and the switching discharge unit, and it is possible to realize a circuit to be used as both the level detection circuit and the switching discharge means with a simple circuit configuration in which the output terminal of the pulse driving circuit is connected to the input/output port of the microprocessor through the resistor.

DESCRIPTION OF EXEMPLARY EMBODIMENTS

Figure 1:
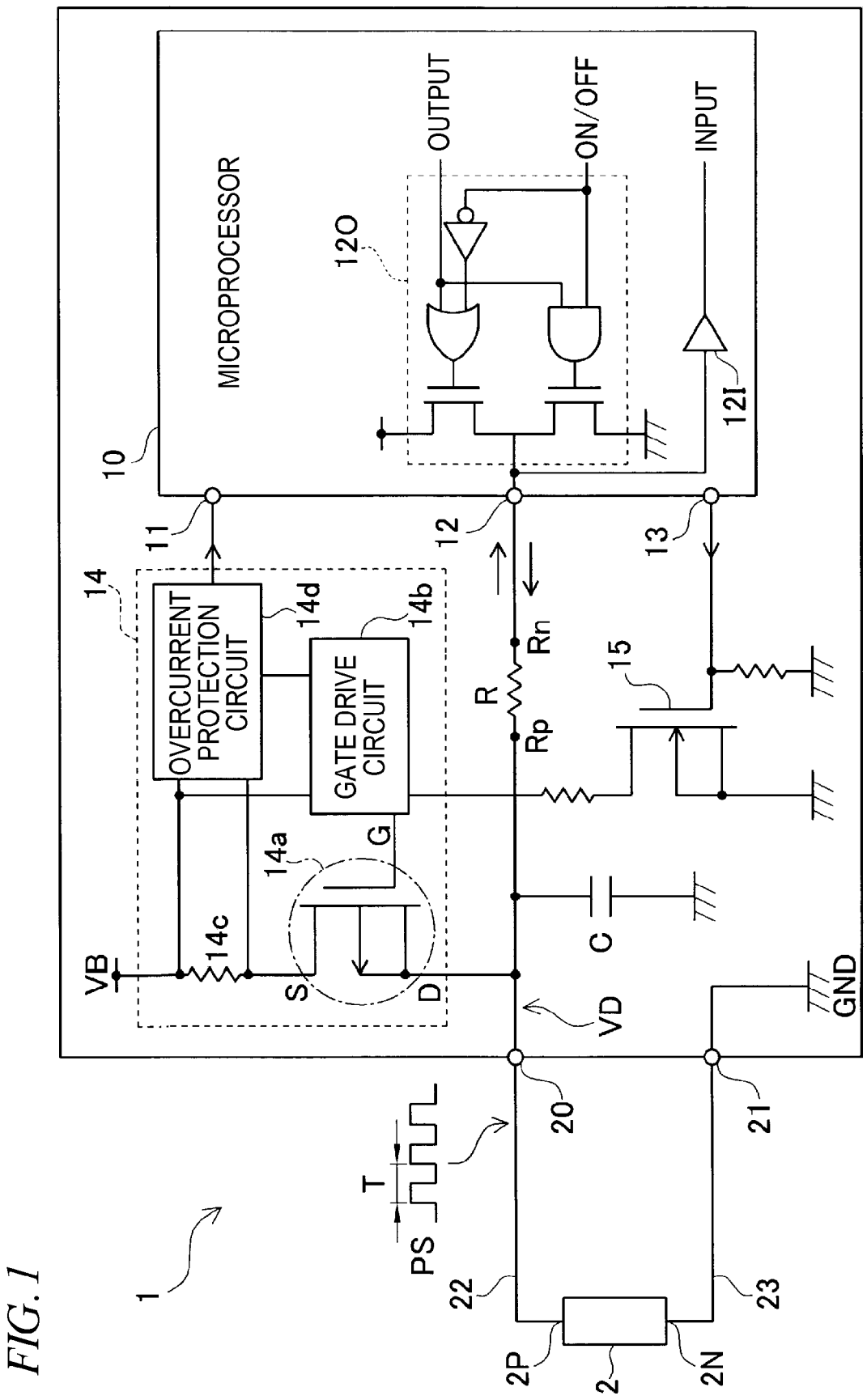
FIG. 1 is an explanatory view showing the schematic configuration of a load driving device according to an embodiment.

Hereinafter, an embodiment of the invention will be described referring to the drawings. FIG. 1 is a diagram showing the schematic configuration of a load driving device 1 of the present invention. The load driving device 1 drives a resistive load, and in the present invention, a case where the load driving device 1 is used to drive a heater 2 which heats a detection element (not shown) of an oxygen sensor primarily made of a solid electrolyte body, such as zirconia, is illustrated. Description of the oxygen sensor and the detection element will be omitted.

The load driving device 1 includes a microprocessor 10, a pulse driving circuit 14, an FET 15, a resistor R, and the like, and is used to drive the heater 2.

The heater 2 has one end 2N connected to a ground terminal 21 through a lead wire 23, and the ground terminal 21 is ground to a ground potential GND in the circuit of the load driving device 1. The other end 2P of the heater 2 is connected to an output terminal 20 of the pulse driving circuit 14 through a lead wire 22.

The pulse driving circuit 14 is a high-side driver module embedded with a p-channel power MOS-FET (hereinafter, simply referred to as an FET) 14a. The drain D of the FET 14a is connected to the output terminal 20 of the pulse driving circuit 14.

The pulse driving circuit 14 includes a gate drive circuit 14b, a current detection resistor 14c, and an overcurrent protection circuit 14d embedded therein, in addition to the FET 14a. The source S of the FET 14a is connected to a power supply potential VB through the current detection resistor 14c. The gate G of the FET 14a is connected to the gate drive circuit 14b, and the input of the gate drive circuit 14b is extracted outside the pulse driving circuit 14. The overcurrent protection circuit 14d detects a current flowing in the current detection resistor 14c, and when an overcurrent occurs, controls the gate drive circuit 14b to shut off a current flowing in the FET 14a. The overcurrent protection circuit 14d outputs the magnitude of the current flowing in the current detection resistor 14c as a voltage value outside the pulse driving circuit 14.

The microprocessor 10 includes an A/D input port 11, an input/output port 12, and a PWM output port 13. The PWM output port 13 of the microprocessor 10 is connected to the input of the gate drive circuit 14b of the pulse driving circuit 14 through an FET 15 as a preceding-stage driver, and the FET 14a of the pulse driving circuit 14 is turned on/off on the basis of an instruction of the PWM output port 13. Accordingly, the pulse driving circuit 14 switches the power supply potential VB by PWM control to repetitively apply a pulse voltage PS to the heater 2 connected between the output terminal 20 and the ground terminal 21. In the present invention, the repetition cycle T of the pulse voltage PS is 10 msec.

The A/D input port 11 of the microprocessor 10 is connected to the output of the overcurrent protection circuit 14d, and receives the magnitude of the current flowing in the current detection resistor 14c as a voltage value.

The input/output port 12 of the microprocessor 10 is connected to the output terminal 20 of the pulse driving circuit 14 through the resistor R. Specifically, one end Rp of the resistor R is connected to the output terminal 20 of the pulse driving circuit 14, and the other end Rn of the resistor R is connected to the input/output port 12. The input/output port 12 is connected to a digital input circuit 12I and a digital output circuit 12O inside the microprocessor 10. The output of the digital output circuit 12O can be turned on/off by setting, and when the output of the digital output circuit 12O is turned on, the input/output port 12 functions as an output port. When the output of the digital output circuit 12O is turned off, the input/output port 12 functions as an input port, and the voltage input to the input/output port 12 is read as the high level or the low level by the digital input circuit 12I. With this, the input/output port 12 can be switched to the input port or the output port by setting. In the present invention, when the input/output port 12 is set to an input port, the level of an output terminal voltage VD on the output terminal 20 of the pulse driving circuit 14 is read as the high level or the low level by the digital input circuit 12I through the resistor R. When the input/output port 12 is set to an output port, the low level is output from the digital output circuit 12O, and the potential on the other end Rn of the resistor R with one end Rp connected to the output terminal 20 of the pulse driving circuit 14 is set to the low level.

When abnormality occurs in the lead wires 22 and 23 which form the connection path between the pulse driving circuit 14 and the heater 2, a method of detecting abnormality will be discussed.

First, a case where the lead wire 23 which connects the ground terminal 21 and one end 2P of the heater 2 is short-circuited to the ground potential GND in the middle of the path is considered. Since the lead wire 23 is originally grounded to the ground potential GND through the ground terminal 21, even though the lead wire 23 is short-circuited to the ground potential GND in the middle of the path, there is no difference in an electrical circuit from a normal case. For this reason, it is difficult to detect this to be abnormality, and since there is no problem in use, this is excluded from a target to be detected.

If a case where the lead wire 23 is short-circuited to the power supply potential VB is considered, since this becomes short-circuiting of the power supply potential VB and the ground potential GND, abnormality of an overcurrent on the power supply occurs, regardless of driving of the heater 2 by the pulse driving circuit 14. For this reason, this is also excluded from a target to be detected.

Accordingly, in the load driving device 1 of the present invention, detection of short-circuiting to the ground potential GND or the power supply potential of the lead wire 23 is not performed.

Next, a case where the lead wire 22 (first connection path) which connects the output terminal 20 of the pulse driving circuit 14 and the other end 2P of the heater 2 is short-circuited to the ground potential GND is considered. In this case, even though the pulse voltage PS is continuously repetitively applied to the heater 2 by the pulse driving circuit 14, the output terminal voltage VD of the output terminal 20 is fixed at the ground potential GND. For this reason, if the input/output port 12 is set as an input port, and the level of the output terminal voltage VD is detected, the digital input circuit 12I continuously detects the low level. In a normal state where no short-circuiting occurs, the pulse voltage PS is repetitively applied to the heater 2, such that the level of the output terminal voltage VD is repetitively changed between the high level and the low level.

Accordingly, by using this fact, it is possible to determine short-circuiting to the ground potential GND of the lead wire 22. In this state, if the FET 14a of the pulse driving circuit 14 is turned on, since an overcurrent flows in the FET 14a and the current detection resistor 14c, the overcurrent protection circuit 14d detects the overcurrent and shuts off the current flowing in the FET 14a.

However, the load driving device 1 includes a capacitor C between the output terminal 20 of the pulse driving circuit 14 and the ground potential GND. The load driving device 1 does not have a discharge path, through which electric charges charged in the capacitor C can be discharged, other than the heater 2. For this reason, when one of the lead wires 22 and 23 as the connection path of the pulse driving circuit 14 and the heater 2 is disconnected, the discharge path of electric charges charged in the capacitor C is eliminated. Accordingly, in this state, if the pulse driving circuit 14 is turned on once, and the capacitor C is charged, even though the pulse driving circuit 14 is subsequently turned off, electric charges charged in the capacitor C are not discharged, and the output terminal voltage VD is maintained at a potential (high level) near the power supply potential VB. With this, when the input/output port 12 is set as an input port, and the level of the output terminal voltage VD is detected, the digital input circuit 12I continuously detects the high level.

A case where the lead wire 22 (first connection path) which connects the output terminal 20 of the pulse driving circuit 14 and the other end 2P of the heater 2 is short-circuited to the power supply potential VB is considered. In this case, since the output terminal voltage VD of the output terminal 20 is fixed at the power supply potential VB, the digital input circuit 12I continuously detects the high level of the output terminal voltage VD. In this case, since a current flows in the heater 2 directly from the power supply potential VB, even though the FET 14a of the pulse driving circuit 14 is turned on, very little current flows in the FET 14a and the current detection resistor 14c.

Accordingly, in the load driving device 1, only if the level of the output terminal voltage VD is detected as it is, it is not possible to distinguish a case where one of the lead wires 22 and 23 (connection path) is disconnected from a case where the lead wire 22 (first connection path) is short-circuited to the power supply potential VB.

Accordingly, the load driving device 1 first performs determination on the occurrence of short-circuiting the lead wire 22 (first connection path) to the ground potential GND and the occurrence of another problem in the lead wires 22 and 23 (connection path). When it is determined to be the occurrence of another problem, the input/output port 12 is set as an output port, the low level is output from the digital output circuit 12O, and the potential on the other end Rn of the resistor R is set to the low level, such that electric charges charged in the capacitor C are discharged through the resistor R. Thereafter, the input/output port 12 returns to an input port, and the level of the output terminal voltage VD on the output terminal 20 is detected by the digital input circuit 12I, thereby determining whether the lead wire 22 (first connection path) is short-circuited to the power supply potential VB (high level) or the lead wires 22 and 23 (connection path) are disconnected (low level).

Hereinafter, a method of detecting a problem in the connection path (lead wires 22 and 23) of the pulse driving circuit 14 and the heater 2 in the load driving device 1 of the present invention will be specifically described referring to FIGS. 2 and 3.

Figure 2:
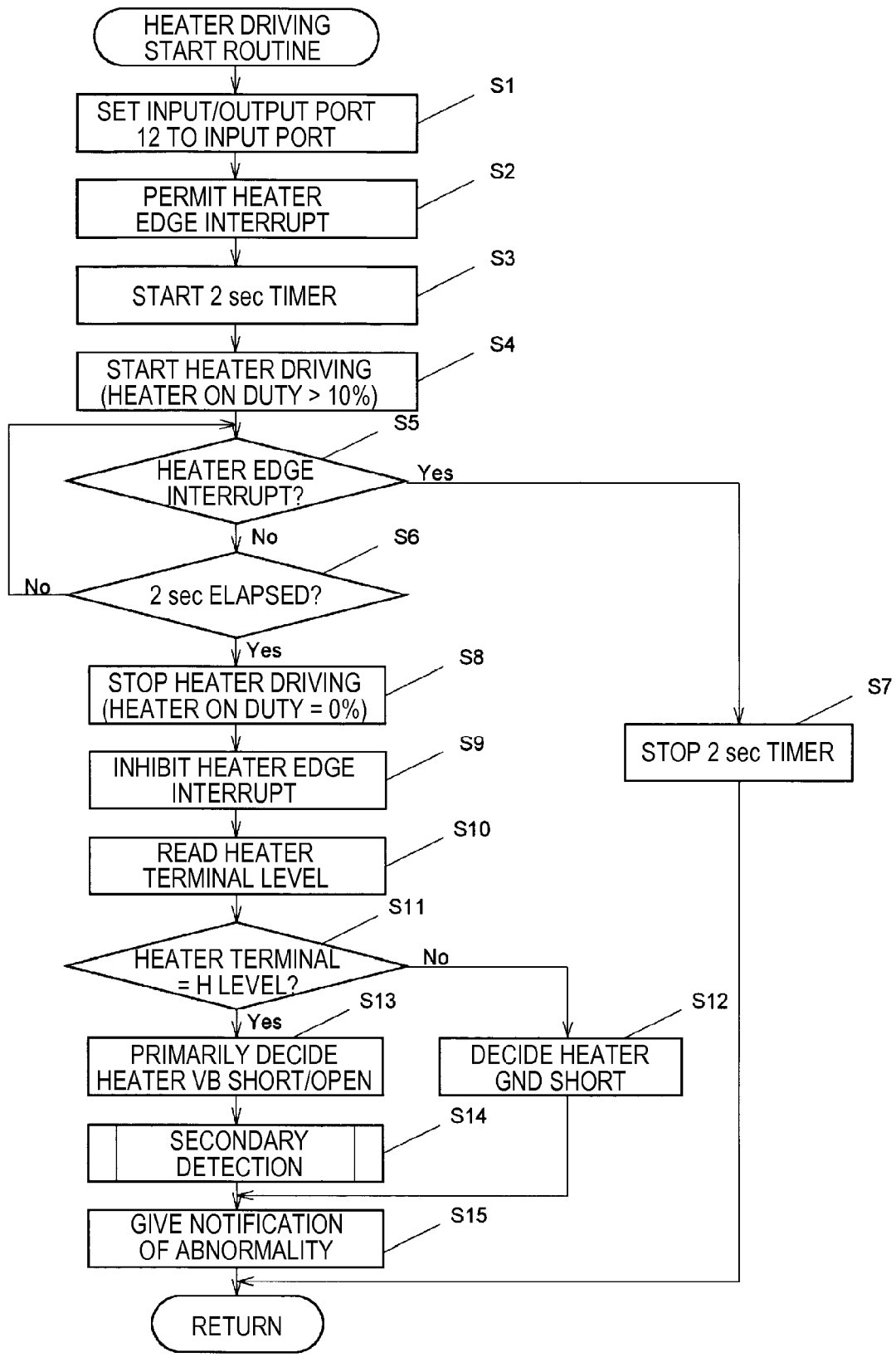
FIG. 2 is a flowchart showing the operation of a microprocessor in the load driving device according to the embodiment.
Figure 3:
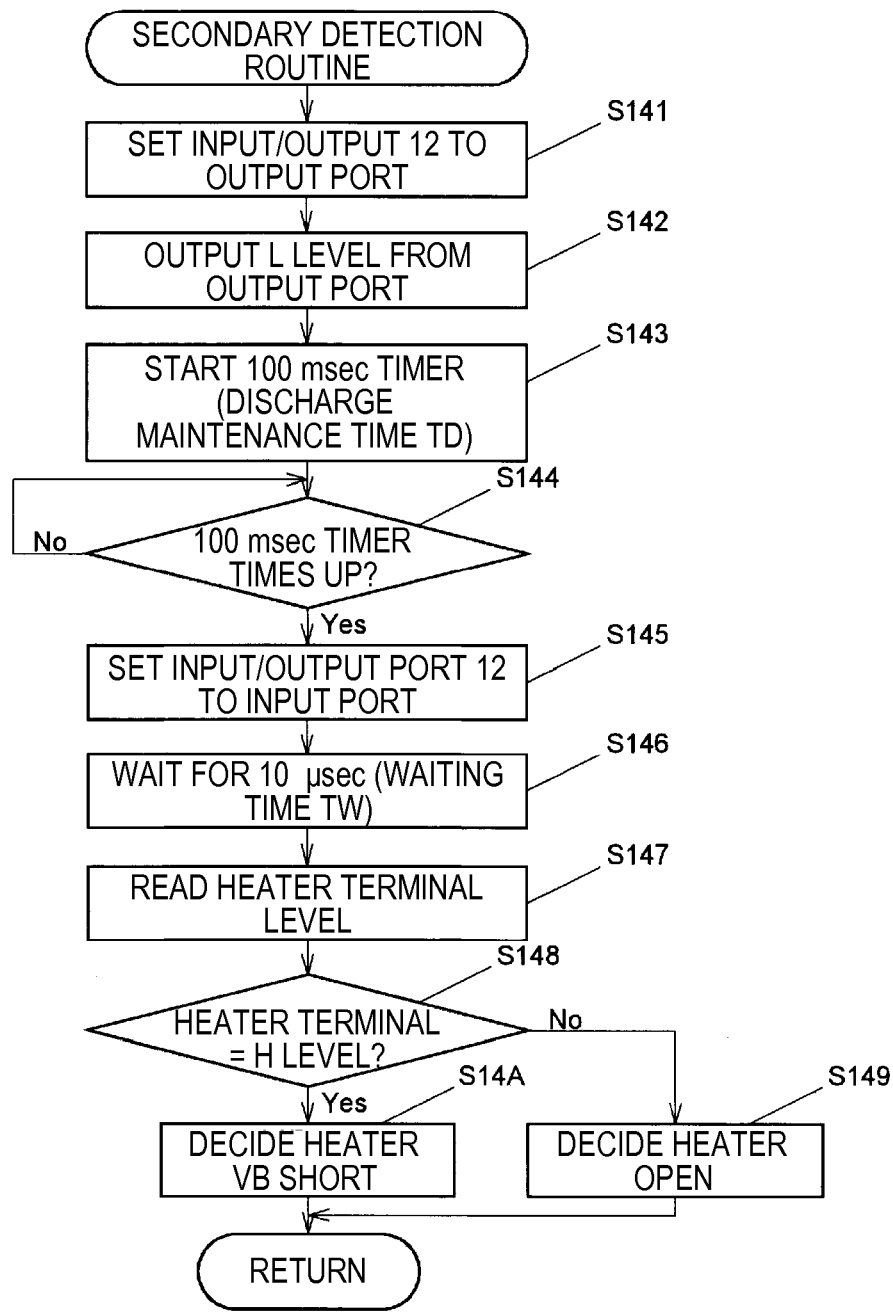
FIG. 3 is a flowchart showing the details of a secondary detection routine.

FIGS. 2 and 3 are flowcharts showing the operation of the microprocessor 10 to detect a problem in the lead wires 22 and 23 (connection path) of the load driving device 1 of the present invention. The microprocessor 10 initially executes a heater driving start routine shown in FIG. 2 when starting the driving of the heater 2.

First, in Step S1, the input/output port 12 of the microprocessor 10 is set as an input port. As described above, the input/output port 12 is connected to the output terminal 20 of the pulse driving circuit 14 through the resistor R, and set as an input port, such that the level of the output terminal voltage VD on the output terminal 20 of the pulse driving circuit 14 is detected as the high level or the low level by the digital input circuit 12I.

Next, in Step S2, a heater edge interrupt is permitted. The heater edge interrupt is an interrupt which occurs each time the level of the output terminal voltage VD of the pulse driving circuit 14 input to the digital input circuit 12I is changed from the high level to the low level or from the low level to the high level. Next, in Step S3, a 2 sec timer which counts two seconds starts so as to monitor the heater edge interrupt over two seconds, that is, the presence/absence of a change between the high level and the low level of the output terminal voltage VD.

Next, in Step S4, the output of the PWM output port 13 of the microprocessor 10 is turned on (0%<duty ratio<100%, repetition cycle T=10 msec), and the pulse driving of the heater 2 by the pulse driving circuit 14 starts. Next, in Step S5, in a state where the heater 2 is driven and the pulse voltage PS is continuously repetitively applied to the heater 2, the presence/absence of the heater edge interrupt permitted in Step S2 is determined. When no heater edge interrupt occurs, in Step S5, it is determined to be No, and the process progresses to Step S6. In Step S6, it is determined whether or not the 2 sec timer started in Step S3 is up, and if the 2 sec elapsed (No), the process returns to Step S5. Accordingly, it waits for the occurrence of the heater edge interrupt while repeating Steps S5 and S6 over two seconds until the 2 sec elapsed.

When there is no abnormality in the lead wires 22 and 23 (connection path), the heater edge interrupt occurs depending on the on/off of the pulse voltage PS by the pulse driving circuit 14. For this reason, in Step S5, it is determined to be Yes, and the process progresses to Step S7. In Step S7, the 2 sec timer stops, and the heater driving start routine ends directly. Subsequently, the driving of the heater 2 continues.

When abnormality, such as short-circuiting or disconnection, occurs in the lead wires 22 and 23 (connection path), the output terminal voltage VD of the pulse driving circuit 14 input to the digital input circuit 12I is fixed at high level or low level, change between the high level and the low level of the output terminal voltage VD can not be detected, and no heater edge interrupt occurs. Then, if 2 sec elapsed while there is no heater edge interrupt in Step S6, it is determined to be Yes, and the process progresses to Step S8. In Step S8, the output of the PWM output port 13 is turned off (duty ratio=0%), the pulse driving circuit 14 is turned off, and the driving of the heater 2 stops. Next, in Step S9, after the heater edge interrupt is inhibited, in Step S10, the level of the output terminal voltage VD of the pulse driving circuit 14 input to the digital input circuit 12I is detected.

Next, in Step S11, the detected level of the output terminal voltage VD of the pulse driving circuit 14 is checked. When the level of the output terminal voltage VD read in Step S10 is the low level, in Step S11, it is determined to be No, and the process progresses to Step S12. This case represents that the lead wire 22 (first connection path) which is connected to the other end 2P of the heater 2 is short-circuited to the ground potential GND, and thus the level of the output terminal voltage VD of the pulse driving circuit 14 is fixed at low level.

Accordingly, in Step S12, it is decided that short-circuiting (heater GND short) of the lead wire 22 (first connection path) to the ground potential GND occurs. Next, the process progresses to Step S15, notification of the details of abnormality is given to an external device, and the heater driving start routine ends.

When the level of the output terminal voltage VD detected in Step S10 is the high level, in Step S11, it is determined to be Yes, and the process progresses to Step S13. This case represents that the level of the output terminal voltage VD of the pulse driving circuit 14 is fixed at high level according to another problem, specifically, according to whether the lead wire 22 (first connection path) is short-circuited to the power supply potential VB or the lead wires 22 and 23 (connection path) are disconnected. Accordingly, in Step S13, it is decided that either short-circuiting (hereinafter, referred to as heater VB short) to the power supply potential VB of the lead wire 22 (first connection path) or disconnection (hereinafter, referred to as heater open) in the lead wires 22 and 23 (connection path) occurs. Next, the process progresses to Step S14, and a secondary detection routine described below is executed, and abnormality of either heater VB short or heater open is decided. The process progresses to Step S15, notification of the details of abnormality is given to an external device, and the heater driving start routine ends.

Next, a secondary detection routine shown in the flowchart of FIG. 3 will be described referring to the timing charts of FIGS. 4A and 4B.

First, in Step S141, the input/output port 12 is set as an output port, and next, in Step S142, the low level is output from the digital output circuit 12O (output port) to set the potential on the other end Rn of the resistor R at low level.

Next, in Step S143, a 100 msec timer which counts a discharge maintenance time TD (100 msec) starts. Next, the process progresses to Step S144, and Step S144 is repeated until the 100 msec elapsed (No).

Then, in Step S8, since the pulse driving circuit 14 is already turned off, when one of the lead wires 22 and 23 (connection path) is disconnected (see FIG. 4A), electric charges charged in the capacitor C are discharged toward the digital output circuit 12O (the ground potential GND connected to the digital output circuit 12O) outputting the low level through the resistor R for the discharge maintenance time TD (=100 msec), and the output terminal voltage VD on the output terminal 20 of the pulse driving circuit 14 connected to one end Rp of the resistor R falls down to the low level. In the present invention, the discharge maintenance time TD (=100 msec) is longer than the repetition cycle T (=10 msec) of the pulse voltage PS, and electric charges charged in the capacitor C are sufficiently discharged, thereby falling the output terminal voltage VD down to the low level.

When the lead wire 22 (first connection path) is short-circuited to the power supply potential VB (see FIG. 4B), even though the low level is output from the digital output circuit 12O to set the potential on the other end Rn of the resistor R at low level, electric charges are supplied from the power supply potential VB. For this reason, the level of the output terminal voltage VD on the output terminal 20 of the pulse driving circuit 14 connected to one end Rp of the resistor R is not changed while being fixed at the power supply potential VB.

If 100 msec elapsed and the discharge maintenance time TD ends, in Step S144, it is determined to be Yes, and the process progresses to Step S145.

In Step S145, the setting of the input/output port 12 is switched from the output port to the input port. With this, the output of the digital output circuit 12O outputting the low level is turned off. Next, in Step S146, a waiting time TW of 10 μsec elapsed, and in Step S147, the level of the output terminal voltage VD on the pulse driving circuit 14 input to the digital input circuit 12I is read.

When the lead wire 22 (first connection path) is short-circuited to the power supply potential VB (see FIG. 4B), and when the setting of the input/output port 12 is switched from the output port to the input port, and the level of the output terminal voltage VD is detected by the digital input circuit 12I, the waiting time TW (=10 μsec) is set to a time longer than a first return time TR1 required for until the output terminal voltage VD returns to the high level. When one of the lead wires 22 and 23 (connection path) is disconnected (see FIG. 4A), the waiting time TW is set to a time shorter than a second return time TR2 required for until the capacitor C after discharge is charged again by an overcurrent or the like, and the output terminal voltage VD returns to the high level. That is, after the output of the digital output circuit 12O is turned off, the waiting time TW (=10 μsec) is set to a time for which the digital input circuit 12I can reliably detect the low level when one of the lead wires 22 and 23 (connection path) is disconnected and the high level when the lead wire 22 (first connection path) is short-circuited to the power supply potential VB.

Next, in Step S148, the level of the output terminal voltage VD of the pulse driving circuit 14 read in Step S147 is checked. If the output terminal voltage VD of the pulse driving circuit 14 is at low level, in Step S148, it is determined to be No, and the process progresses to Step S149. In Step S149, it is decided that disconnection (heater open) of the lead wires 22 and 23 (connection path) occurs. If the output terminal voltage VD of the pulse driving circuit 14 is at high level, in Step S148, it is determined to be Yes, and the process progresses to Step S14A. In Step S14A, it is decided that short-circuiting (heater short) to power supply potential to the lead wire 22 (first connection path) occurs. If Step S149 or Step S14A ends, the secondary detection routine ends, the process returns to Step S15 of the heater driving start routine, and notification of the details of the decided abnormality is given.

In the present invention, the heater 2 corresponds to a resistive load, the lead wire 22 corresponds to a first connection path, and the lead wires 22 and 23 correspond to a connection path. The resistor R and the digital input circuit 12I connected to the input/output port 12 of the microprocessor 10 correspond to a level detection circuit. The resistor R, the digital output circuit 12O connected to the input/output port 12 of the microprocessor 10, and the microprocessor 10 which executes Steps S141 to S145 correspond to a switching discharge unit. The output of the low level from the digital output circuit 12O over the discharge maintenance time TD corresponds to the switching of the switch in the switching discharge unit from the non-discharge side to the discharge side, and switching of the setting of the input/output port 12 from the output port to the input port and turning off the output of the digital output circuit 12O (output port) corresponds to returning from the discharge side to the non-discharge side. The microprocessor 10 which executes Steps S146 to S147 corresponds to a post-discharge detection unit.

The microprocessor 10 which executes Steps S5 to S13 corresponds to a preliminary detection unit, and the microprocessor 10 which executes Steps S11 to S12 corresponds to a ground potential short-circuiting determination unit. The microprocessor 10 which executes Steps S148 to S149 and S14A corresponds to a determination unit.

As described above, the load driving device 1 of the present invention includes a switching discharge unit (Steps S141 to S145) for forming the discharge path through which electric charges charged in the capacitor C are discharged in a state where the application of the pulse voltage PS by the pulse driving circuit 14 stops and the output terminal voltage VD is maintained at high level. The low level is output from the digital output circuit 12O (output port) to switch the switch of the switching discharge unit to the discharge side. Thereafter, the input/output port 12 is switched from the output port to the input port to turn off the output of the low level, and after the switch returns from the discharge side to the non-discharge side, it is detected by the post-discharge detection unit (Steps S146 to S147) whether the level of the output terminal voltage VD is at high level or low level.

With this, it is possible to appropriately detect the occurrence of disconnection in the connection path (lead wires 22 and 23) of the pulse driving circuit 14 and the heater 2 and the occurrence of short-circuiting to the power supply potential VB of the first connection path (lead wire 22).

The load driving device 1 of the present invention includes a preliminary detection unit (Steps S5 to S13), and when the high level is continuously detected by the preliminary detection unit, the switching discharge unit (Steps S141 to S145) is executed. With this, before the execution of the switching discharge unit, it is possible to appropriately detect the occurrence of abnormality of either disconnection in the connection path (lead wires 22 and 23) or short-circuiting of the first connection path (lead wire 22) to the power supply potential.

In the load driving device 1 of the present invention, when the low level is continuously detected by the preliminary detection unit (Steps S5 to S13), it is determined to be the occurrence of short-circuiting of the first connection path (lead wire 22) to the ground potential GND. With this, in regard to abnormality in the connection path (lead wires 22 and 23), it is possible to appropriately detect short-circuiting of the first connection path (lead wire 22) to the ground potential GND, in addition to disconnection in the connection path (lead wires 22 and 23) and short-circuiting of the first connection path (lead wire 22) to the power supply potential VB.

In the load driving device 1 of the present invention, after switching to the discharge side in the switching discharge unit (Steps S141 to S145) (the output of the low level from the digital output circuit 12O (output port)) returns to the non-discharge side (the output of the digital output circuit 12O (output port) is turned off), it waits for until the waiting time TW (=10 μsec) longer than the first return time TR1 (see FIG. 4B) elapsed, and the level of the output terminal voltage VD is detected by the level detection circuit 12I. With this, when short-circuiting of the first connection path (lead wire 22) to the power supply potential VB occurs, it is possible to appropriately detect the high level of the output terminal voltage VD which should be detected by the post-discharge detection unit (Steps S146 to S147), thereby reliably detecting the occurrence of short-circuiting of the first connection path (lead wire 22) to the power supply potential VB.

When disconnection in the connection path (lead wires 22 and 23) occurs, after switching of the switch to the discharge side in the switching discharge means (Steps S141 to S145) (the output of the low level from the digital output circuit 12O (output port)) returns to the non-discharge side (the output of the digital output circuit 12O (output port) is turned off), the capacitor C may be charged again by the effect of an overcurrent current or the like, and the output terminal voltage VD may gradually increase and return to the high level.

Figure 4A:
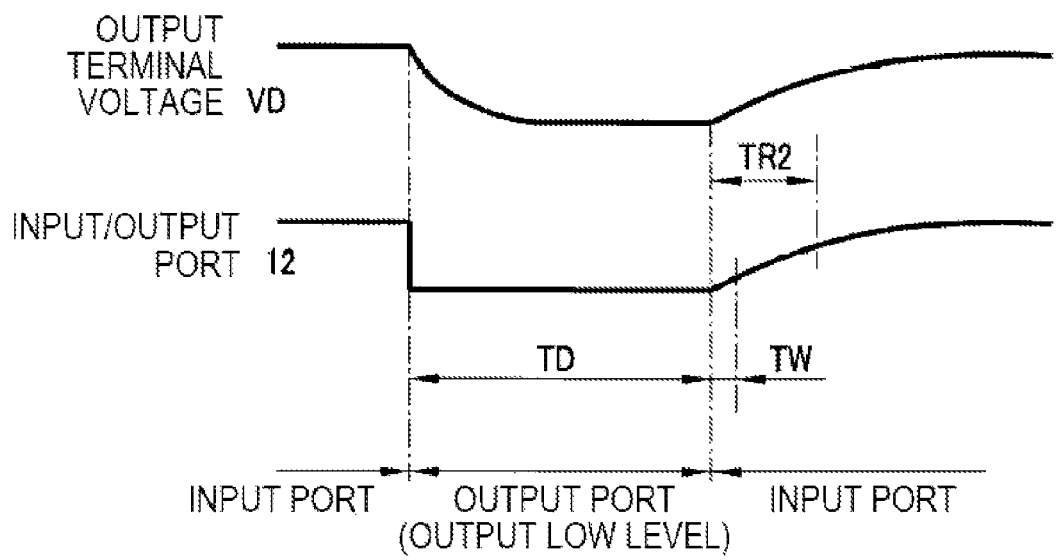
FIGS. 4A and 4B are timing charts showing the operation of the secondary detection routine.
Figure 4B:
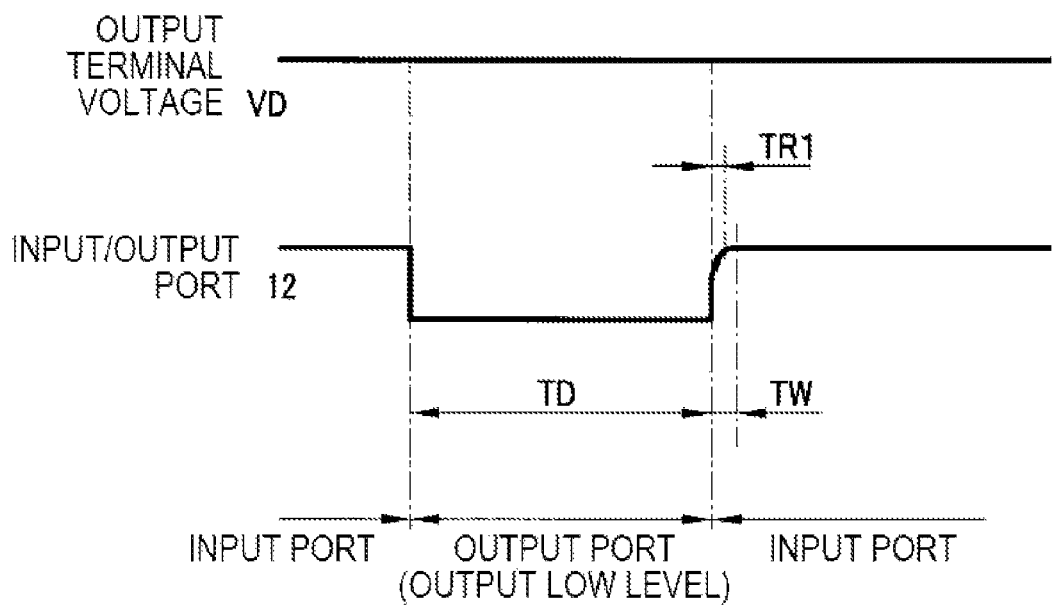

In the load driving device 1 of the present invention, the waiting time TW (=10 μsec) in the post-discharge detection unit (Steps S146 to S147) is set to a time shorter than the second return time TR2 (see FIG. 4A). For this reason, even though the output terminal voltage VD gradually increases, there is no case where this is detected as the high level. With this, when disconnection occurs in the connection path (lead wires 22 and 23), it is possible to appropriately detect the low level of the output terminal voltage VD which should be detected by the post-discharge detection unit (Steps S146 to S147), thereby reliably detect the occurrence of disconnection in the connection path (lead wires 22 and 23).

In the load driving device 1 of the present invention, the discharge maintenance time TD (=100 msec) by the switching discharge means (Steps S141 to S145) is set to a time longer than the repetition cycle T (=10 msec) of the pulse voltage PS. For this reason, when disconnection in the connection path (lead wires 22 and 23) occurs, electric charges charged in the capacitor C are sufficiently discharged, thereby sufficiently falling the output terminal voltage VD of the pulse driving circuit 14 down to the low level. With this, it is possible to appropriately perform determination in the determination unit (Steps S146 to S149 and S14A).

In the load driving device 1 of the present invention, the switching discharge unit (Steps S141 to S145) includes the resistor R with one end Rp connected to the output terminal 20 of the pulse driving circuit 14 as the discharge path. The potential on the other end Rn of the resistor R is set at low level over the discharge maintenance time TD. With this, it is possible to discharge the capacitor with a simple configuration.

In the load driving device 1 of the present invention, the level detection circuit includes the digital input circuit 12I (input port) connected to the input/output port 12 of the microprocessor 10, and the output terminal 20 of the pulse driving circuit 14 is connected to the input/output port 12 through the resistor R. The switching discharge unit includes the digital output circuit 12O (output port) which is connected to the input/output port 12, and sets the potential on the other end Rn of the resistor R at low level. Accordingly, the level detection circuit and the switching discharge means can use the input/output port 12 together, and the resistor R of the switching discharge unit can also be used as a resistor for protecting the digital input circuit (input port 12I) in the level detection circuit.

With this, in regard to the level detection circuit (the resistor R and the digital input circuit 12I) and the switching discharge unit (the resistor R and the digital output circuit 12O), it is not necessary to prepare individual circuits in the microprocessor 10, and it is possible to realize a circuit to be used as both the level detection circuit and the switching discharge unit with a simple configuration in which the output terminal 20 of the pulse driving circuit 14 is just connected to the input/output port 12 of the microprocessor 10 through the resistor R.

Although the invention has been described on the basis of the embodiment, it should be noted that the invention is not limited to the foregoing embodiment, and may be appropriately changed and applied within the scope departing from the spirit of the invention.

For example, in the embodiment, a configuration in which the resistor R is connected to the input/output port 12 of the microprocessor 10, the switching discharge unit sets the input/output port 12 as an output port to output the low level from the digital output circuit 12O, and the potential on the other end Rn of the resistor R is set at low level is made. However, the switching discharge unit may have a configuration in which the other end Rn of the resistor R is connected to the ground potential (low level) using a switching element, such as a transistor, or a relay.

Although in the embodiment, the input/output port 12 is switched to an input port and an output port by setting, and used by both the level detection circuit (digital input circuit 12I) and the switching discharge unit (digital output circuit 12O), the resistor R may not be used by both the level detection circuit and the switching discharge unit, and a digital input circuit connected to an input-only port different from switching discharge unit may be used as a level detection circuit.

In the embodiment, as a resistive load, a case where a heater which heats a detection element of an oxygen sensor primarily made of a solid electrolyte body is driven has been described. However, a resistive load is not limited thereto, and for example, a heater which heats a detection element of a metal oxide semiconductor gas sensor, a heater for heating a fluid, or the like is used.

What is claimed is:

1. A load driving device for driving a resistive load including a first end being grounded and a second end, the load driving device comprising:

a pulse driving circuit which has an output terminal connected to the second end of the resistive load, is configured to repetitively apply a pulse voltage to the resistive load, and includes a capacitor disposed between the output terminal and a ground potential;

a level detection circuit configured to detect whether an output terminal voltage on the output terminal of the pulse driving circuit is at high level or at low level;

a switching discharge unit which forms a discharge path through which electric charges charged in the capacitor are discharged by switching a switch from a non-discharge side to a discharge side, wherein when disconnection occurs in a connection path between the pulse driving circuit and the resistive load in a state where the application of the pulse voltage by the pulse driving circuit stops and the output terminal voltage is maintained at the high level, the switching discharge unit switches the switch to the discharge side over a discharge maintenance time sufficient to change the output terminal voltage from the high level to the low level;

a post-discharge detection unit configured to detect the level of the output terminal voltage by the level detection circuit after the switch returns to the non-discharge side; and a determination unit configured to determine the occurrence of disconnection in the connection path when the post-discharge detection unit detects the low level and determine the occurrence of short-circuiting of a first connection path connecting the output terminal and the second end of the resistive load to a power supply potential when the post-discharge detection unit detects the high level.

2. The load driving device according to claim 1 further comprising:

a preliminary detection unit configured to detect whether the output terminal voltage continuously has the high level, the low level, or otherwise in a state where the pulse driving circuit repetitively apply the pulse voltage continues to the resistive load before the execution of the switching discharge unit, wherein the switching discharge unit is executed when the preliminary detection unit detects the continuation of high level.

3. The load driving device according to claim 2 further comprising:
a ground potential short-circuiting determination unit configured to determine the occurrence of short-circuiting of the first connection path to the ground potential when the continuation of low level is detected by the preliminary detection unit.

4. The load driving device according to claim 1, wherein
the post-discharge detection unit waits for until a waiting time elapses after the switch returns from the discharge side to the non-discharge side and detects the level of the output terminal voltage by the level detection circuit, and
the waiting time is set to a time longer than a first return time required for until the output terminal voltage returns to the high level after the switch returns from the discharge side to the non-discharge side when the first connection path is short-circuited to the power supply potential.

5. The load driving device according to claim 4, wherein
in the post-discharge detection unit, the waiting time is set to a time shorter than a second return time required for until the output terminal voltage returns to the high level after the switch returns from the discharge side to the non-discharge side when disconnection in the connection path occurs.

6. The load driving device according to claim 1, wherein
the discharge maintenance time is set to a time longer than a repetition cycle of the pulse voltage output from the pulse driving circuit.

7. The load driving device according to claim 1, wherein
the switching discharge unit includes a resistor having one end connected to the output terminal as the discharge path, and switches the switch to the discharge side to set the potential on the other end of the resistor at the low level over the discharge maintenance time.

8. The load driving device according to claim 7 further comprising:
a microprocessor,
wherein the level detection circuit includes a digital input circuit which is provided in the microprocessor and connected to an input/output port of the microprocessor,
wherein the output terminal of the pulse driving circuit is connected to the input/output port through the resistor, and
wherein the switching discharge unit includes a digital output circuit which is provided in the microprocessor, connected to the input/output port, and sets the potential on the other end of the resistor at low level.

* * * * *